United States Patent
Nordquist et al.

(12) 
(10) Patent No.: US 6,453,551 B1
(45) Date of Patent: Sep. 24, 2002

(54) MANUFACTURE FOR FEED-THROUGH DEVICES

(76) Inventors: Thaddeus E. Nordquist, 324 Feather Tree Dr., Clearwater, FL (US) 33765; Eric Lawrence Nordquist, 809 Normandy Rd., Clearwater, FL (US) 33760; Kevin T. Luce, 14878 55th Way North, Clearwater, FL (US) 33760

( * ) Notice: Subject to any disclaimer, the term of this patent is extended or adjusted under 35 U.S.C. 154(b) by 181 days.

(21) Appl. No.: 09/587,071

(22) Filed: Jun. 2, 2000

(51) Int. Cl.[7] .............................................. H01R 43/04
(52) U.S. Cl. .......................... 29/862; 29/863; 29/857; 361/302; 361/303; 361/306.1; 361/309; 439/271; 439/274; 439/279; 439/588
(58) Field of Search .......................... 29/862, 863, 871, 29/857, 861; 361/302, 306.1, 309, 306.2, 303, 307, 320, 321.6, 321.5; 439/271, 274, 275, 279, 587, 588

(56) References Cited

U.S. PATENT DOCUMENTS 5,499,448 A * 3/1996 Tournier et al. .............. 29/863
5,650,759 A  7/1997 Hittman et al.
5,811,728 A * 9/1998 Maeda ......................... 16/2.2
6,275,369 B1 * 8/2001 Stevenson et al. .......... 361/302

OTHER PUBLICATIONS

Catalog, EMI Filter Co.

* cited by examiner

Primary Examiner—R. Chang
(74) Attorney, Agent, or Firm—Mark A. Navarre

(57) ABSTRACT

An improved method of manufacture for wire feed-through devices, wherein a pre-formed tubular seal having a central axial opening for accommodating the wire insulates the wire from the ferrule and provides a tight environmental seal between the ends of the ferrule. The seal is radially compressed and then inserted, either by itself or with the wire, into the central opening of the ferrule so that the seal is maintained in compression between the wire and an inside diameter of the ferrule. In devices where one end of the ferrule opening is enlarged to accommodate one or more filter elements, the seal is positioned in the narrow portion of the ferrule opening, and additionally serves to maintain an inherent concentricity of the wire within the ferrule during installation and attachment of the filter elements, and injection or insertion of encapsulant material into the enlarged portion of the ferrule opening.

5 Claims, 3 Drawing Sheets

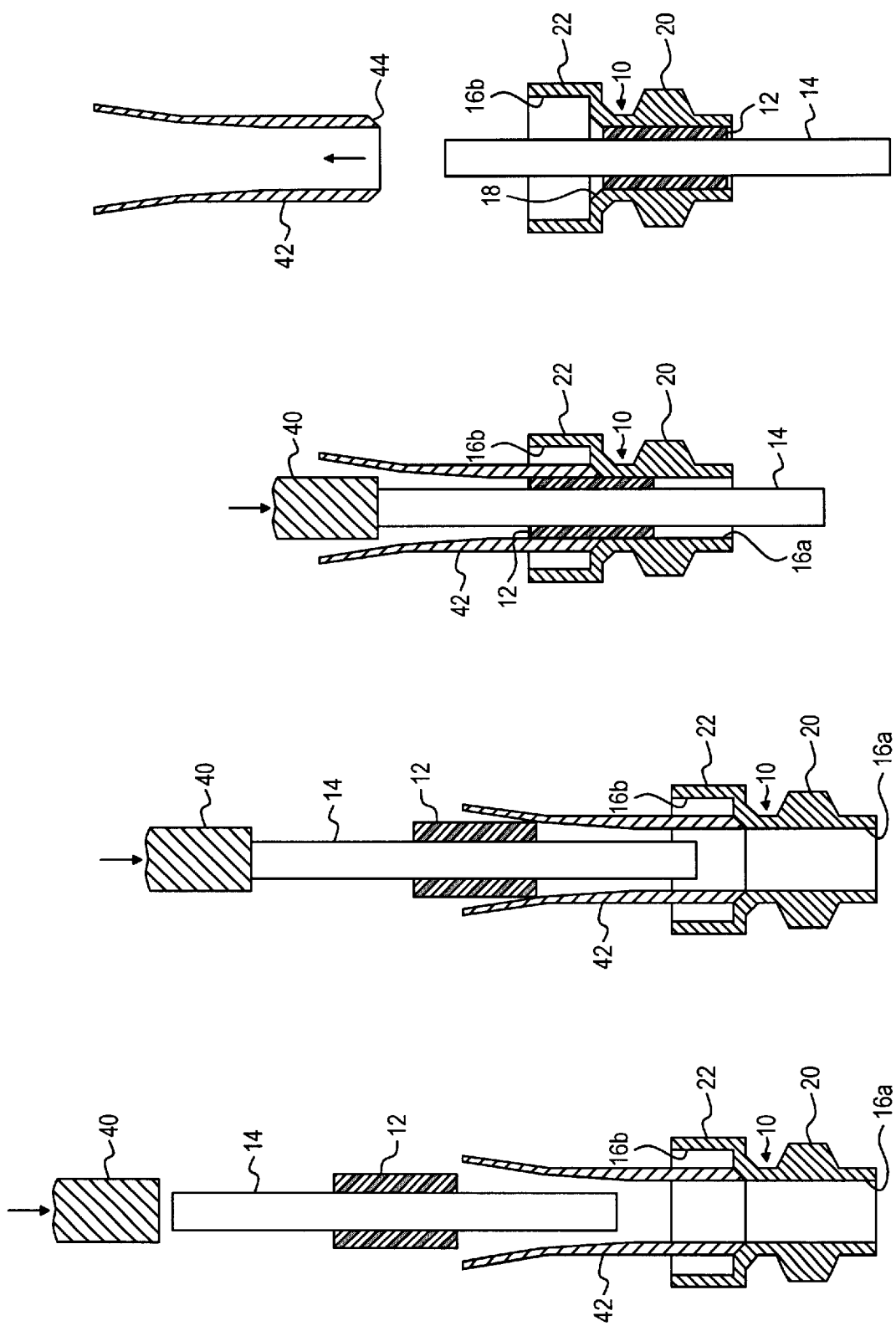

MANUFACTURE FOR FEED-THROUGH DEVICES

TECHNICAL FIELD

This invention relates to feed-through devices such as feed-through filters, and more particularly, to an improved method of manufacture thereof.

BACKGROUND OF THE INVENTION

Broadly, a feed-through is a device used to enable communication of some sort through a membrane such as a bulkhead, housing or wall, and comprises a tubular ferrule that is threaded, pressed or soldered into an opening of the membrane. The ferrule has a central opening which may be left open for pneumatic, liquid or gaseous communication through the membrane, or may accommodate a linear or rotary shaft for mechanical communication through the membrane, or may accommodate an optical fiber or metal wire for signal optical or electrical signal communication through the membrane.

A common usage of feed-though devices is for electrical signal transmission to or from an electronic module. In such an application, a solid wire passes through the central opening of the ferrule, and an encapsulant surrounding the wire within the central opening insulates the wire from the ferrule and provides an environmental seal between the module and the ambient medium. If a hermetic seal is required (in medical applications, for example), the space between the wire and the inside diameter of the ferrule may be filled with a glass or ceramic composition, which is then fired and bonded to the ferrule and wire by brazing; see, for example, the U.S. Pat. No. 5,650,759 to Hittman et al., issued on Jul. 22, 1997. In other applications, an epoxy or thermosetting plastic material may be used as an encapsulant. Once the ferrule is threaded, pressed or soldered into an opening in the module wall/membrane, the end of the wire disposed inside the housing is attached to a circuit supported therein, while the end of the wire outside the housing may be mated to a suitable connector, for example. In a particularly advantageous mechanization, a portion of the ferrule is enlarged to accommodate a capacitor (discoidal or tubular or chip) electrically coupled between the wire and the ferrule/housing; such devices are commonly referred to as feed-through filters, and provide high frequency filtering in addition to electrical signal communication. Inductive and/or resistive elements may also be placed in the ferrule to form various well-known filter topologies.

The manufacture of feed-through devices typically involves a significant amount of manual labor, and is therefore both costly and time-consuming. Additionally, special fixtures must be provided for maintaining concentricity of the wire within the ferrule opening prior to injection of the encapsulant. Further, the opening must be sealed at both ends of the ferrule, and it is difficult to reliably inject the encapsulant into small openings without leaving air pockets, disturbing the orientation of the wire, or smearing encapsulant on the outer periphery of the ferrule. Accordingly, what is needed is a new method of manufacturing feed-through devices that requires less manual labor and special fixturing, and that consistently produces a high quality insulative and environmental seal with less opportunity for encapsulant spillage and smearing.

SUMMARY OF THE INVENTION

The present invention is directed to an improved method of manufacture for wire feed-through devices, wherein a pre-formed tubular seal having a central axial opening for accommodating the wire insulates the wire from the ferrule and provides a tight environmental seal between the ends of the ferrule. The seal is radially compressed and then inserted, either by itself or with the wire, into the central opening of the ferrule so that the seal is maintained in compression between the wire and an inside diameter of the ferrule. In devices where one end of the ferrule opening is enlarged to accommodate one or more filter elements, the seal is positioned in the narrow portion of the ferrule opening, and additionally serves to maintain an inherent concentricity of the wire within the ferrule during installation and attachment of the filter elements, and injection of encapsulant material into the enlarged portion of the ferrule opening. The "wire" may be a metal wire for accommodating electrical or mechanical feed-through functions, an optical wire for accommodating optical communication functions, a hollow tube, or some other kind of wire.

The method is particularly amenable to automation, which significantly reduces the cost and time of manufacture. Additionally, the method provides a superior environmental seal between the ends of the ferrule, while eliminating prior manufacturing drawbacks associated with maintaining concentricity of the wire and injecting encapsulant into a narrow opening between the wire and the inside diameter of the ferrule.

BRIEF DESCRIPTION OF THE DRAWINGS

FIGS. 3A, 3B, 3C and 3D detail a sequence of steps for carrying out the manufacturing method generally illustrated in FIG. 1A.

DESCRIPTION OF THE PREFERRED EMBODIMENT

Figure 1A:
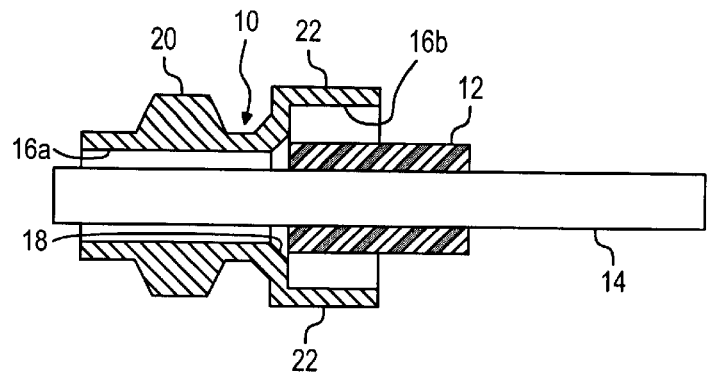
FIGS. 1A–1B generally illustrate alternate manufacturing methods of this invention, as applied to a filtered feed-through device.
Figure 1B:
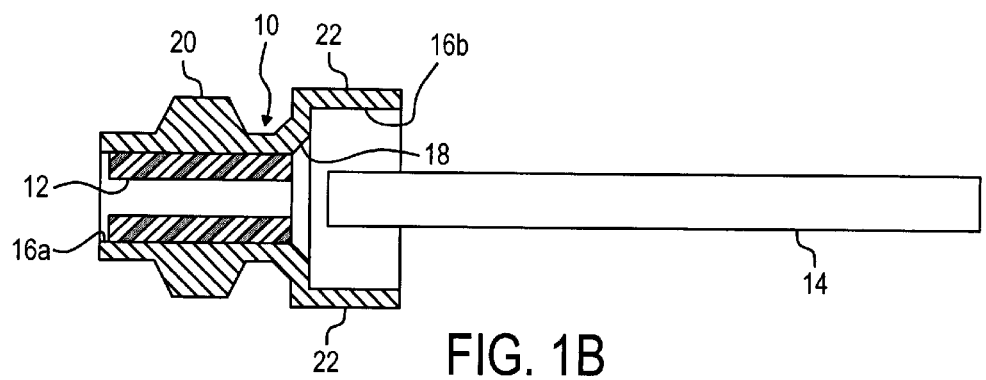
Figure 2:
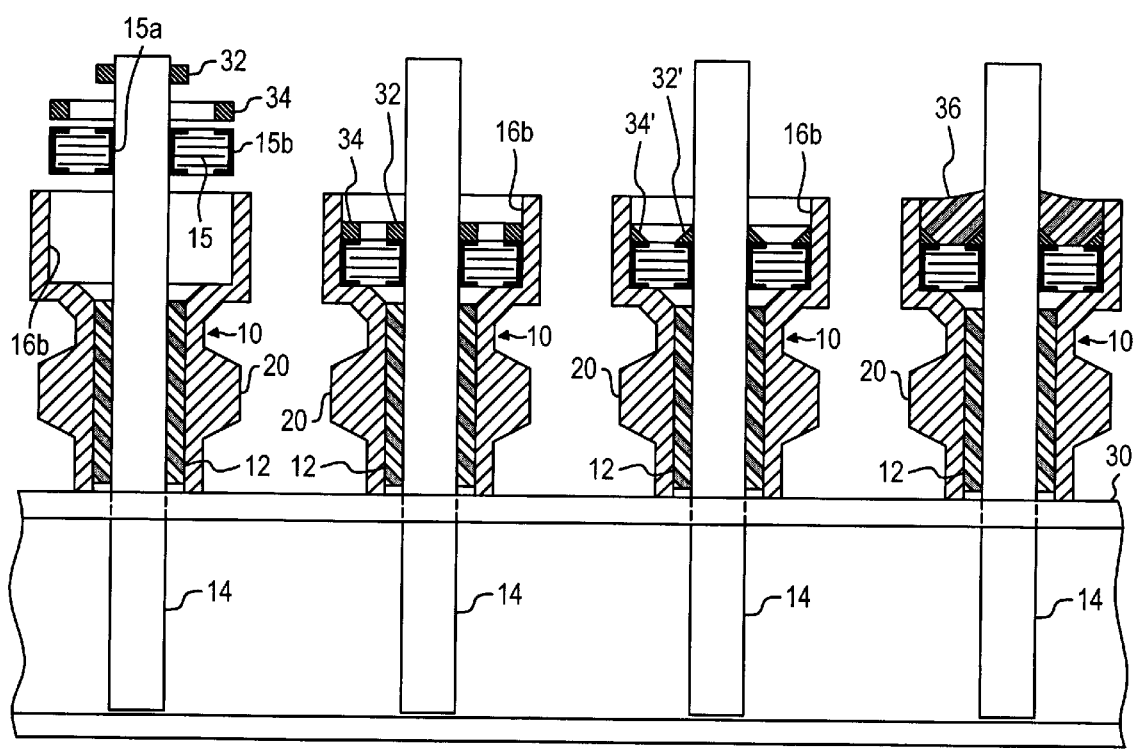
FIG. 2 illustrates a manufacturing sequence for completing assembly of the filtered feed-through devices of FIGS. 1A–1B.

Referring to the drawings, FIGS. 1A, 1B and 2 generally depict the manufacturing method of this invention in the context of a feed-through filter comprising a metal ferrule 10, a tubular elastomeric seal 12, a solid metal wire 14, and a filter element 15. The ferrule 10 and seal 12 are depicted in cross-section, while the wire 14 is depicted in profile, and the filter element 15 is depicted diagrammatically. The manufacturing operations depicted in FIGS. 1A and 1B represent alternate embodiments of a pre-assembly portion of the manufacturing process, while the operations depicted in FIG. 2 represent a final portion of the manufacturing process.

The ferrule 10 has a circular central opening comprising a narrow portion 16a and a wide portion 16b separated by a conical taper 18. The narrow portion 16a has an inside diameter that is sized relative to the outside diameter of wire 14 to accommodate an intermediate insulating material, while the wide portion 16b is sized to accommodate a filter element, as described below in reference to FIG. 2. The exterior periphery of ferrule 10 lateral of the narrow portion 16a is provided with screw threads, as designated by the reference numeral 20, while the exterior periphery lateral of the wide portion 16b is provided with a plurality of flat faces 22. At installation of the feed-through, a tool engages the flat faces 22 and rotates the feed-through about the longitudinal axis of opening 16a, 16b so that the threads 20 engage the periphery of an opening formed in a membrane such as the housing wall of an electronic module. Alternately, the ferrule 10 may be provided with splines or knurls instead of threads 20, in which case, the tool linearly displaces the ferrule 10 to press the splines/knurls into engagement the periphery of the membrane opening. If the ferrule 10 is to be soldered in place, the threads, splines or knurls may be eliminated entirely, if desired.

The tubular seal 12 is a compressible elastomer such as natural rubber, silicon rubber, butyl, neoprene, ethylene propylene, nitrile, urethane, a fluro-elastomer, or any similar material. The seal 12 is radially compressed prior to insertion into the narrow opening portion 16a of ferrule 10, and two alternate methods of insertion are generally illustrated by FIGS. 1A and 1B. According to the method of FIG. 1A, the seal 12 is first fitted on the wire 14, and then inserted along with wire 14 into the narrow opening portion 16a; this method is depicted in detail in FIGS. 3A–3D. According to the method of FIG. 1B, the seal 12 is inserted into the narrow opening portion 16a, and the wire 14 is then inserted through the seal 12; this method is depicted in detail in FIGS. 4A–4E. The ferrule 10 with inserted wire 14 and compressed seal 12 is depicted in FIG. 2.

FIG. 2 illustrates the final portion of the feed-through manufacturing process; that is, subsequent to the pre-assembly operations described above in reference to FIGS. 1A–1B. The ferrule/seal/wire pre-assembly is placed in a simple fixture 30, which may be nothing more than a thick plate with a plurality of openings sized to accommodate a length of the wire 14 protruding from the narrow opening portion 16a of ferrule 10, so that the end of ferrule 10 rests atop the fixture 30 as shown. For purposes of illustration, FIG. 2 depicts a series of four feed-through devices, representing successively steps in the final portion of the manufacturing operation, as viewed from left to right.

In the first step depicted in FIG. 2, the filter element 15 is inserted into the wide opening portion 16b of ferrule 10, and a pair of solder rings 32, 34 are placed atop the filter element 15. The filter element 15 is illustrated as a discoidal capacitor having a circular central opening designed to accommodate wire 14 and a pair of metallic terminals 15a, 15b. The terminal 15a covers the inner periphery of the central opening, and includes upper and lower flange portions extending away from the opening, with the exposed flange portion being engaged by the solder ring 32. The terminal 15b covers the outer periphery of the filter element 15, and includes upper and lower flange portions extending toward the central opening, with the exposed flange portion being engaged by the solder ring 34. In the next step of the manufacturing operation, heat is applied to the solder rings 32, 34 to re-flow the solder material, forming a first solder joint 32' between the inner terminal 15a and wire 14, and a second solder joint 34' between the outer terminal 15b and the ferrule 10. In use, a filter feed-through is typically installed in a grounded metal housing, so that the capacitor 15 acts as a high-frequency path of electrical conduction between the wire 14 and ground. Other filter elements may be used instead of or in addition to capacitor 15, as will be well known to those skilled in the art. Finally, an encapsulant 36 such as epoxy is injected or otherwise inserted into the unoccupied portion of the wide opening portion 16b, and cured to form an environmental seal that protects the capacitor 15 and solder joints 32', 34' from corrosion and the like.

The significance of the present invention lies in the usage of a radially compressed seal 12 in the narrow opening portion 16a of ferrule 10, as described above in reference to FIGS. 1A or 1B. The seal 12, which may be installed by itself or along with wire 14 as explained above, provides a superior environmental seal between the ends of the ferrule 10, approaching the sealing characteristics of a glass-fired hermetic seal, but at a much lower manufacturing cost. And unlike a glass-fired seal, the compressive elastomer seal is very durable, and is not subject to cracking during its manufacture, installation or usage. Additionally, in filter feed-through devices, the wire 14 is compressively sealed in ferrule 10 as a pre-assembly operation, with the seal 12 serving to maintain an inherent concentricity of the wire 14 within the ferrule opening 16a, 16b during installation and attachment of the filter element 15, and injection or insertion of encapsulant 36 into the wide opening portion 16b of ferrule 10.

Prior to the method of this invention, manufacturers had to use special fixtures for maintaining concentricity of the wire 14 within the ferrule opening 16a, 16b prior to curing of the encapsulant, and the assembly operation included an additional step of injecting encapsulant material into the small annular opening between the wire 14 and the narrow portion 16a of the ferrule opening. The finished devices had to be cleaned due to smeared encapsulant (particularly on threads 20), and inspected for defects due to manufacturing variability; not infrequently, parts had to be scrapped due to lack of concentricity between wire 14 and ferrule 10, and/or poor encapsulant sealing due air pockets and the like.

Thus, the manufacturing method of the present invention more consistently produces feed-through devices exhibiting high quality environmental sealing and concentricity of the wire 14 within ferrule 10. Moreover, the manufacturing method of this invention is particularly amenable to automation, significantly reducing the cost and time of manufacture. Automated processes for inserting the wire 14 and seal 12 into ferrule 10 are depicted in FIGS. 3A–3D and 4A–4E, with FIGS. 3A–3D corresponding to the manufacturing method generally illustrated FIG. 1A, and FIGS. 4A–4E corresponding to the manufacturing method generally illustrated in FIG. 1B.

Referring to FIGS. 3A–3D, the pre-assembly manufacturing steps for combined insertion of seal 12 and wire 14 commence at FIG. 3A, and conclude at FIG. 3D. Essentially, the wire 14 with seal 12 secured thereon is linearly displaced by a plunger 40 (in a downward direction, as viewed in FIGS. 3A–3D), and a reducer tube 42 pre-compresses the seal 12 and transfers the compressed seal 12 into the narrow opening portion 16a of ferrule 10. Preferably, the diameter of plunger 40 significantly exceeds that of wire 14, so that if the seal 12 slips on wire 14, the plunger 40 will engage the end of seal 12 to complete the manufacturing operation, whereupon the wire 14 may be longitudinally positioned separately from the seal 12 as desired. As shown in FIG. 3A, the reducer tube 42 has a inwardly tapered central opening for receiving the wire 14 and seal 12, terminating in a conical taper 44 (see FIG. 3D) that complements the conical taper 18 separating the ferrule opening portions 16a, 16b. With the conical taper 44 seated on the conical taper 18 as shown in FIGS. 3A–3C, the plunger 40 displaces the wire 14 (and seal 12) downwardly as shown in FIGS. 3B, 3C and 3D, first radially compressing the seal 12, and then transferring it into the opening portion 16a in a compressed state. The plunger stops when the seal 12 is substantially even with the narrow end of ferrule 10, as illustrated in FIG. 3D, whereupon the plunger 40 and reducer tube 42 are retracted, completing the pre-assembly.

Figure 4E:
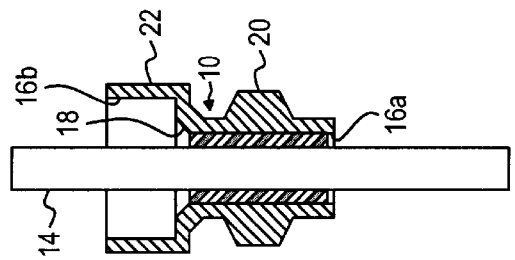
FIGS. 4A, 4B, 4C, 4D and 4E detail a sequence of steps for carrying out the manufacturing method generally illustrated in FIG. 1B.
Figure 4D:
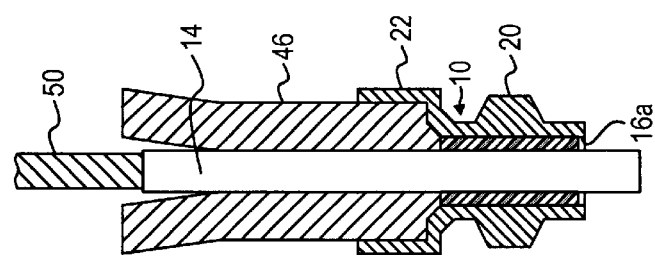
Figure 4C:
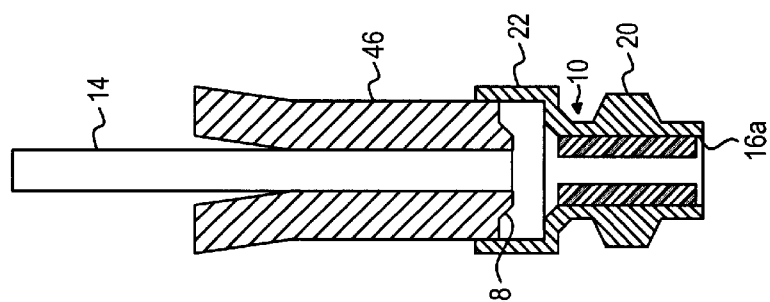
Figure 4B:
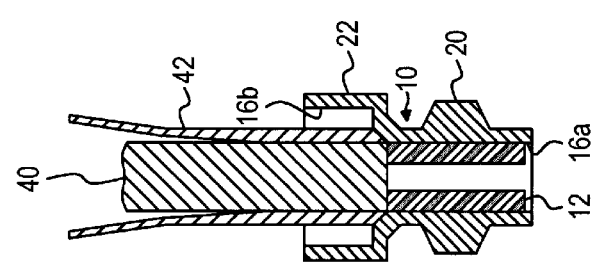
Figure 4A:
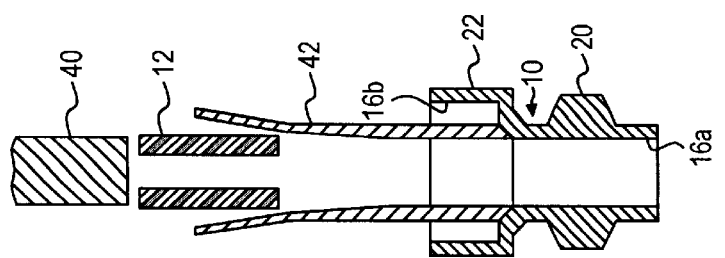

Referring to FIGS. 4A–4E, the pre-assembly manufacturing steps for sequential insertion of seal 12 and wire 14 commence at FIG. 4A, and conclude at FIG. 4E. In the first step, the seal 12 is linearly displaced by plunger 40 (in a downward direction, as viewed in FIGS. 4A–4E), with the reducer tube 42 pre-compressing the seal 12 and then transferring the compressed seal 12 into the narrow opening portion 16a of ferrule 10. As in FIGS. 3A–3D, the reducer tube 42 has a inwardly tapered central opening for receiving the seal 12, terminating in a conical taper 44 that complements the conical taper 18 separating the ferrule opening portions 16a, 16b. With the conical taper 44 seated on the conical taper 18 as shown in FIGS. 4A–4B, the plunger 40 displaces the seal 12 downwardly as shown, first radially compressing the seal 12, and then transferring it into the opening portion 16a in a compressed state. The plunger 40 stops when the trailing end of seal 12 is substantially even with the bottom of taper 18, as illustrated in FIG. 4B, whereupon the plunger 40 and reducer tube 42 are retracted. In the second step, the wire 14 is inserted into a guide tube 46, the out-board end of which is outwardly tapered for easily receiving the wire 14. The in-board end of guide tube 46 has an outer periphery that essentially matches the un-occupied volume of the wide opening portion 16b of ferrule 10, and terminates in a conical taper 48 that complements the conical taper 18 separating the ferrule opening portions 16a, 16b. With the conical taper 48 seated on the conical taper 18 as shown in FIG. 4D, a wire-sized plunger 50 displaces the wire 14 downwardly as shown in FIG. 4D into the central opening of seal 12, radially compressing the seal 12 as it is inserted. The plunger 50 stops when the wire 14 has been fully inserted, whereupon the plunger 50 and guide tube 46 are retracted, the pre-assembled part being illustrated in FIG. 4E.

In a simple (that is, non-filtered) feed-through device, the ferrule 10 is not enlarged at one end as shown, and the above-described pre-assembly (according to either FIGS. 3A–3D or 4A–4E) constitutes the entire assembly. In a filter feed-through device, the pre-assembled units are then transferred to another station for final assembly, as described above in reference to FIG. 2.

In summary, the above-described method of manufacture produces consistent high quality feed-through devices with superior environmental sealing characteristics and at low cost due to automated pre-assembly. While described in reference to the illustrated embodiment, it is expected that various modifications in addition to those mentioned above will occur to those skilled in the art. For example, filter elements may be placed in the narrow opening portion 16a of ferrule 10, the seal 12 may be inserted from the either end of the ferrule 10, the seal 12 may be sized for insertion into the wide opening portion 16b of ferrule 10, and so on. Additionally, the inside diameter of the ferrule opening into which the seal 12 is inserted may itself be tapered for enhanced environmental sealing. Accordingly, it will be understood that manufacturing methods incorporating these and other modifications may fall within the scope of this invention, which is defined by the appended claims.

What is claimed is:

1. A method of manufacture of a feed-through device including a ferrule having an axial opening and a wire that passes through the axial opening without touching the ferrule, comprising the steps of:

providing a cylindrical elastomeric seal element having an axial opening for receiving said wire;

providing a conical taper on the ferrule at one end of said axial opening;

providing a reducer tube having an axial opening that tapers radially inwardly and terminates in a conical taper that complements the conical taper of said ferrule;

positioning the reducer tube so that the conical taper seats on the conical taper of said ferrule;

radially compressing the seal element and transferring the radially compressed seal element into the axial opening of said ferrule by linearly displacing the seal element through the axial opening of said reducing tube and into the axial opening of said ferrule;

removing the reducer tube after the step of linearly displacing the seal element; and inserting the wire through the axial opening of said seal element after said seal element has been radially compressed and transferred into the axial opening of said ferrule, so that said wire radially compresses said seal element as the wire is inserted into the axial opening of said seal element.

2. The method of manufacture of claim 1, further including a step of:

inserting the wire through the axial opening of said seal element prior to radially compressing the seal element and transferring the radially compressed seal element into the axial opening of said ferrule.

3. The method of manufacture of claim 1, further including a step of:

inserting the wire through the axial opening of said seal element prior to linearly displacing the sealing element through the axial opening of said reducing tube and into the axial opening of said ferrule.

4. The method of manufacture of claim 1, wherein the step of inserting the wire further includes steps of:

providing a wire guide having an axial opening for receiving said wire, said wire guide having an end portion shaped to match an un-occupied portion of the axial opening of said ferrule, including the conical taper formed on said ferrule;

seating the wire guide on said ferrule; and linearly displacing said wire through the axial opening of said wire guide and into the axial opening of said seal element.

5. The method of manufacture of claim 1, wherein the axial opening of the ferrule includes a first portion in which said seal element is disposed, and a second portion that is enlarged to receive a filter element, and the seal element maintains a concentricity of the wire with respect to the axial opening of the ferrule.

* * * * *